United States Patent [19]

Rehak et al.

[11] Patent Number: 4,688,067
[45] Date of Patent: Aug. 18, 1987

[54] CARRIER TRANSPORT AND COLLECTION IN FULLY DEPLETED SEMICONDUCTORS BY A COMBINED ACTION OF THE SPACE CHARGE FIELD AND THE FIELD DUE TO ELECTRODE VOLTAGES

[75] Inventors: Pavel Rehak, Patchogue, N.Y.; Emilio Gatti, Lesmo, Italy

[73] Assignee: The United States of America as represented by the Department of Energy, Washington, D.C.

[21] Appl. No.: 583,553

[22] Filed: Feb. 24, 1984

[51] Int. Cl.[4] ............... H01L 27/14; H01L 29/80; H01L 29/78; H01L 31/00
[52] U.S. Cl. .................................. 357/29; 357/22; 357/24; 250/370
[58] Field of Search ................... 357/22, 24, 29; 250/370

[56] References Cited

U.S. PATENT DOCUMENTS

| | | | |
|---|---|---|---|
| 2,914,665 | 11/1959 | Linder | 357/29 |
| 3,207,902 | 9/1965 | Sandborg | 250/370 |
| 3,529,161 | 9/1970 | Oosthoek et al. | 250/370 |
| 3,621,256 | 11/1971 | Cacheux et al. | 250/370 |
| 3,624,399 | 11/1971 | Boer et al. | 250/370 |
| 3,700,932 | 10/1972 | Kahng | 357/24 M |
| 3,858,232 | 12/1974 | Boyle et al. | 357/24 R |
| 3,863,072 | 1/1975 | Garlin et al. | 250/370 |
| 3,925,669 | 12/1975 | Glasow | 250/370 |
| 4,147,933 | 4/1979 | Rougeot et al. | 250/370 |

FOREIGN PATENT DOCUMENTS 974659 9/1975 Canada .................. 357/24 M

OTHER PUBLICATIONS

Gatti et al, "The Concept of a Solid State Drift Chamber" DPF Workshop Collider Detectors, Lawrence Berkeley Lab., Feb. 28–Mar. 4, 1983.
Gatti et al, "Semiconductor Drift Chamber . . ." 2nd Pisa Meeting on Advanced Detectors, Grosetto, Italy, Jun. 3–7, 1983.

Primary Examiner—Gene M. Munson
Attorney, Agent, or Firm—Vale P. Myles; Paul A. Gottlieb; Judson R. Hightower

[57] ABSTRACT

A semiconductor charge transport device and method for making same, characterized by providing a thin semiconductor wafer having rectifying junctions on its opposing major surfaces and including a small capacitance ohmic contact, in combination with bias voltage means and associated circuit means for applying a predetermined voltage to effectively deplete the wafer in regions thereof between the rectifying junctions and the ohmic contact. A charge transport device of the invention is usable as a drift chamber, a low capacitance detector, or a charge coupled device each constructed according to the methods of the invention for making such devices. Detectors constructed according to the principles of the invention are characterized by having significantly higher particle position indicating resolution than is attainable with prior art detectors, while at the same time requiring substantially fewer readout channels to realize such high resolution.

2 Claims, 16 Drawing Figures

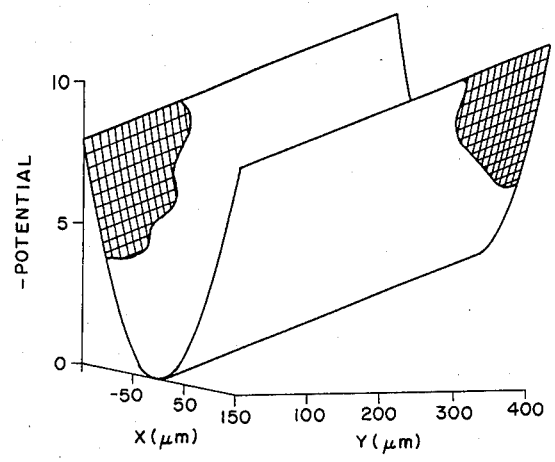
Fig. 3
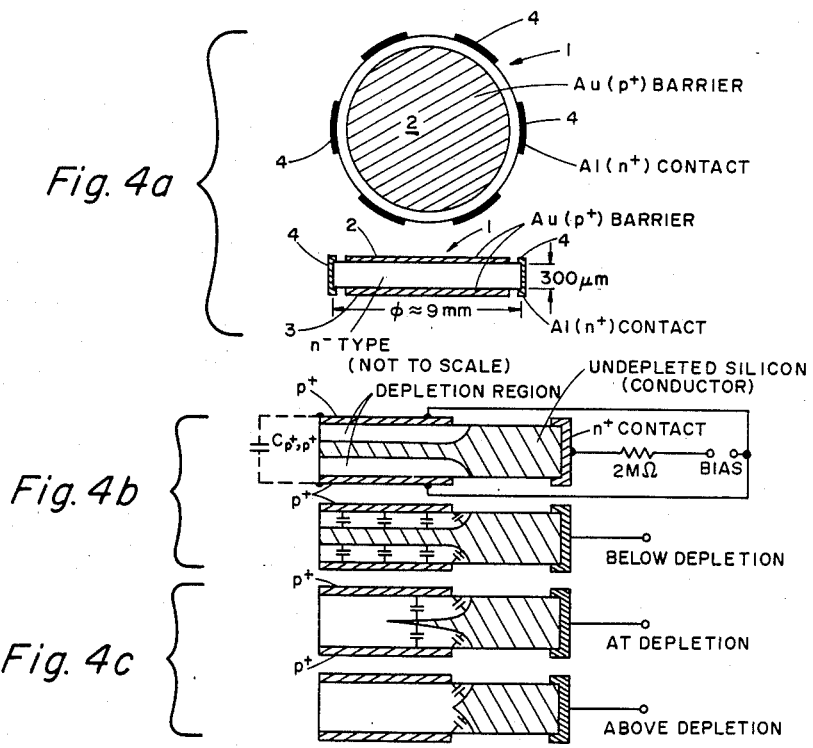
Fig. 4a
Fig. 4b
Fig. 4c

CARRIER TRANSPORT AND COLLECTION IN FULLY DEPLETED SEMICONDUCTORS BY A COMBINED ACTION OF THE SPACE CHARGE FIELD AND THE FIELD DUE TO ELECTRODE VOLTAGES

The U.S. Government has rights in this invention pursuant to Contract Number DE-AC02-76CH00016, between the U.S. Department of Energy and Associated Universities Inc.

The invention relates to charge transport devices and to methods for making such devices and, more particularly, relates to semiconductor detection devices in which a thin semiconductor wafer is fully depleted from a small capacitance virtual electrode affixed somewhere on, or adjacent to, an edge of the wafer; then through the electrode voltages a second electric field is super imposed on the depleted semiconductor to transport charge carriers in a way that is suitable for position sensing of ionizing particles and radiation. The method of the invention is practiced to manufacture such semiconductor wafers that are adapted for use as semiconductor drift chambers, ultra-low capacitance radiation detectors and/or photodiodes, or fully depleted charged-coupled devices.

BACKGROUND OF THE INVENTION

It is well known that in many radiation detector applications the use of semiconductor devices affords substantial advantages. For example, in low energy radiation spectroscopy, semiconductor detectors have been used to achieve excellent energy resolution. On the other hand, in the field of high energy physics, position sensing of charged particles is still performed mostly with gas proportional or drift chambers. Because of the continuing desire to develop detectors with better energy resolution for use in the field of high energy physics, there has been for the last several years, a growing interest in the application of semiconductors as high resolution position sensing detectors for such particle physics applications.

One example of a semiconductor detector applied as a particle position indicating means is shown in U.S. Pat. No. 3,863,072, which issued Jan. 28, 1975. The disclosed wafer of doped semiconductor material is provided with a metallic thin film that is vapor deposited on one of its faces. As is also shown in the patent, it is well known in such detector applications to use semiconductor materials that are heavily doped with either n-type or p-type impurities. A common technique used in the manufacture of such prior art semiconductor particle position detectors is to mount electrodes on opposite major surfaces of a semiconductor wafer, with at least some of the electrotrodes subdivided into a plurality of parallel strips. One array of stripped electrodes is crossed with other stripped electrodes to form a so called checker board counter that allows the precise point where a particle enters the wafer to be positioned. U.S. Pat. No. 3,529,161, which issued Sept. 15, 1970, discloses such a known prior art type of semiconductor radiation particle positione detecting device. Also, U.S. Pat. No. 3,415,992 shows a semiconductor radiation detector having a readout arrangement with good sensitivity for obtaining highly accurate particle position readouts. The position resolution of particles by these disclosed devices is determined to a degree of accuracy that is dependent on the line density of the incorporated plurality of overlapping elongated contacts. Finally, U.S. Pat. No. 3,624,399, which issued Nov. 30, 1971, shows a radiation detector that is similar to those shown in some of the above mentioned patents, in that it comprises a semiconductor disk having crossing strip electrodes on its opposite sides to detect the position of particle developed charge carriers. The disclosed detector is characterized by incorporating means for reducing cross talk between the strip electrodes.

By way of further background for the invention disclosed herein, an example of a typical position sensitive silicon microstrip type semiconductor detector is schematically illustrated in FIG. 1. In this prior art type of detector, a single voltage provides the field for depleting the semiconductor crystal and the drift field for charge carriers that are produced in the detector by passage of ionizing particles through it. As illustrated, the detector consists of a thin n-type silicon wafer, which typically is approximately 300 microns in thickness. The wafer has a continuous n+n junction on one of its sides and a strip pattern of p+n junctions on its opposite side, as shown. To operate the detector, a suitable reverse bias voltage is applied across the wafer by a conventional source of electric potential (not shown), thereby to deplete the detector and to provide the desired collection field. When a fast charged particle passes through the detector, it produces electron/-hole pairs that drift toward the electrodes under the influence of the applied electric field, as indicated by the arrows next to the plus and minus symbols shown for the electrons and holes in FIG. 1. Such motion of the charge carriers induces a signal in an external amplifier (not shown) which is suitably connected between the n+p+contacts. Position sensing of the charged particle in this type of detector configuration is determined by the p+contacts. As explained more fully in several of the patents identified above, the principle of particle postion detection, in the type of detector illustrated in FIG. 1 usually requires the same number of amplifiers as the number of individual p+contact strips used on the detector. In fact, it is possible to reduce the number of such amplifiers that is required, up to a factor of 10, by using charge division readout; however a price for such reduction is paid both in the resultant complexity of the readout channels and in the sacrifice of double track resolution. Furthermore, even when such charge division readout systems are utilized, the number of readout channels required per unit length of detector still remains undesirably large (normally in the order of 20 to 500 channels per centimeter of detector length). Other factors presently limiting the application of such microstrip silicon detectors are; the volume requirement, the heat dissipation problem and the connection problems inherent in the use of such a large number of readout channels. Accordingly, it remains desirable to provide a semiconductor charge transport device that can be applied in the high energy physics field to provide a high resolution particle position detector, which achieves such high resolution while requiring the use of hundreds of times fewer readout channels than are required by related prior art particle position detectors.

OBJECTS OF THE INVENTION

A primary object of the invention is to combine a radiation detector with a charge transport device that is fully depleted from a small capacitance, so-called virtual electrode and in which a charge transport field exists independent of the depletion potential.

Another object of the invention is to provide a method of making a charge transport device of a very thin, relatively large area semiconductor wafer that has a small capacitance contact formed on one of its edges or on the surface boundary of the detector, through which contact the wafer is fully depleted responsive to an appropriate voltage being applied thereto.

A further object of the invention is to provide a method for making a charge transport device in which complete depletion of a semiconductor wafer is followed by imposition of a second electric field on the wafer to transport charge carriers in a way that is suitable for sensing the position of ionizing particles and radiation introduced into the device.

Still another object of the invention is to provide a semiconductor drift chamber that is operable as a particle position detector having a resolution substantially higher than prior art fast-particle position detectors, while requiring hundreds of times fewer readout channels than such prior art detectors.

Still another object of the invention is to provide an ultra-low capacitance ionizing radiation and photon detector in which the effective detector capacitance is independent of the detector area.

Still another object of the invention is to provide a low capacitance ionizing radiation and photon detector having a very small capacitance, so-called virtual electrode contact that can be practically a pin-point sized anode.

A further object of the invention is to provide a fully depleted charge-coupled device made from a thin semiconductor wafer.

Additional objects and advantages of the invention will become apparent to those skilled in the art from the description of it that follows, considered in conjunction with the accompanying drawings.

SUMMARY OF THE INVENTION

In one preferred embodiment of the invention a charge transport device is formed of a wafer of semiconductor material that has rectifying electrodes formed on two of its opposed major surfaces, and that is further provided with a small capacitance ohmic contact affixed immediately adjacent to one of its thinner edge surfaces. A predermined bias voltage is applied across portions of the wafer, between the contact and the respective rectifying electrodes, in order to reverse bias the rectifying junction of each of the electrodes and to form fully depleted regions in the wafer between the ohmic contact and the electrodes. When ionizing particles are passed into these depleted regions, they impose a moving charge that is detected on suitable output means (preamplifiers) operatively coupled to the ohmic contact. It is, thus, possible to read out changes in current that are induced at the contact due to or as a function of, transport of such a charge in the depleted regions of the device toward the contact. According to the method of the invention, such a charge transport device is manufactured by providing in operative relationship the respective semiconductor wafer, electrodes and contact components, followed by the step of applying a predetermined bias voltage to fully deplete desired regions of the wafer, after which ionizing particles are introduced into the depleted regions for detecting charges due to the particles passage into those regions. A particle position readout is achieved by operatively coupling suitable output means (preamplifiers) to the ohmic contact thereby to detect changes in current that are induced at the contact responsive to transport of the charge in the depleted regions. Also, by measuring the time of introduction of the ionizing particles into the depleted region of the wafer, and by measuring the time thereafter that a maximum current is induced at the contact readout, responsive to transport of a charge into the contact, a position measurement of high resolution is performed.

BRIEF DESCRIPTION OF THE DRAWINGS

FIG. 2 is divided into sections 2a, 2b, 2c, and 2d to illustrate steps in the depletion of a semiconductor wafer from a so called virtual electrode.

FIG. 3 is a schematic illustration of the resulting electric potential function, in two dimensions, of a fully depleted single n-type silicon wafer of the kind shown in FIG. 2d; as it would exist after an additional linear electric field is superposed along the y-axis. Such a superposed field stabilizes the full depletion of the semiconductor by continuously sweeping away all charges.

FIG. 4 includes sections 4a, 4b and 4c. The upper section of FIG. 4a is a schematic plan view of the top of a disc shaped silicon device of a type that was constructed to test and demonstrate the mechanism of full depletion achieved by practicing the subject invention. The drawing does not illustrate component parts to scale. The lower section of FIG. 4a shows a side plan view, in cross section, and not to scale, of the silicon device illustrated in the upper section of FIG. 4a.

FIG. 4b includes two sections each of which are schematic, cross sectional, side plan views, not to scale, of a portion of the silicon device illustrated in FIG. 4a. Also shown in the upper sections of FIG. 4b are a source of bias voltage and associated circuitry for measuring the capacitance between the two p+ electrodes of the device.

FIG. 4c contains two sections, which respectively show schematic, side plan views in cross section of the segment of the silicon device illustrated in FIG. 4b; illustrating various degrees of depletion of the device responsive to increased levels of the applied bias voltage. As shown in the upper section, at nearly full depletion the conductive channel at the middle of the device retracts causing the capacitance to drop abruptly. At higher bias voltages, the remaining capacitance is the much lower level capacitance between the p+ contacts and the undepleted silicon around the n+ contact, as shown in the bottom section of FIG. 4c.

BRIEF DESCRIPTION OF THE PREFERRED EMBODIMENT

Figure 1:
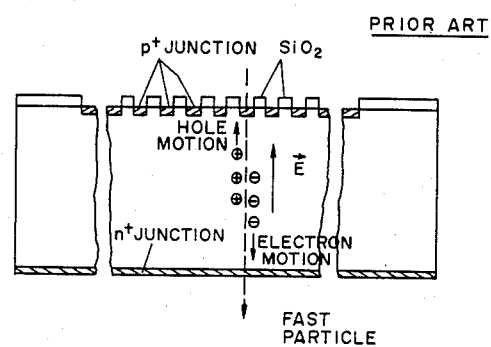
FIG. 1 is a schematic, fragmentary, plan view, partly in cross section, and not to scale, of one side of a prior art type of semiconductor detector, showing characteristic features of such a typical silicon microstrip particle detector.
Figure 2A:
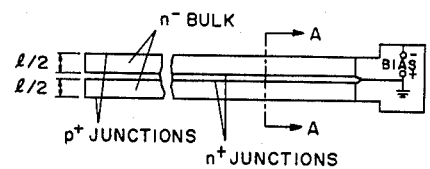
FIG. 2a schematically illustrates two standard n, p junction detectors arranged with their respective n+ electrodes in contact with one another. A source of bias voltage and associated circuitry are shown for reverse biasing the junctions of the detectors.

Before describing features of the structure, and the novel steps of the method, of the preferred embodiments of the invention, reference is made to FIGS. 2a–2d in order explain some of the principles involved in practicing the invention. It will be seen that by applying these principles we have discovered that it is possible to fully deplete a thin, large area semiconductor wafer through a small capacitance contact that is positioned either on, or immediately adjacent to, the edge of the wafer. Such a small contact has been found to operate essentially as a so-called virtual electrode, as will become more apparent from the following discussion. Understanding these principles will also make it clear that after the complete depletion of a semiconductor wafer, it is possible within certain limits to superimpose a second electric field on the wafer thereby to transport charge carriers in a way that is suitable for sensing or detecting the position of ionizing particles passed into the wafer. Accordingly, the purpose of FIGS. 2a–2d herein is to illustrate a process for achieving depletion of a semiconductor wafer from a so called virtual electrode. To explain the principles involved in this process, there is shown in FIG. 2a a pair of n-type silicon wafer detectors each of which have a p+ and n+ junctions on opposite sides thereof. The two detectors are shown as being placed parallel to one another in such a way that their respective n+ electrodes are positioned in contact with each other. A bias voltage is applied, through the circuit shown, to reverse bias both detectors.

Figures 2B, 2C:
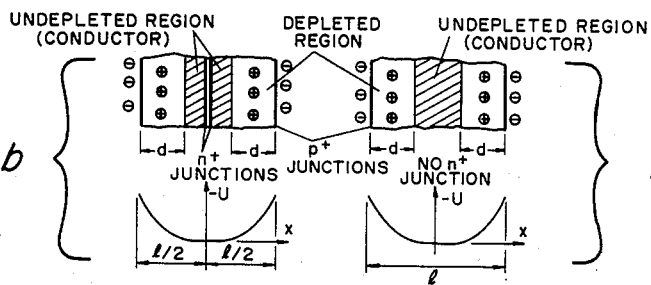
FIG. 2b, in its top section is a schematic, fragmentary, cross sectional side view, along the plane A—A of FIG. 2a, illustrating the depletion regions of the two detectors after a reverse bias voltage has been applied to them with the circuit indicated in FIG. 2a. A profile of the electric potential across the two detectors is shown by the curve in the lower section of FIG. 2b.
FIG. 2c, in its top section, is a schematic side plan view of a fragment of a single n-type semiconductor wafer having p+ contacts on both of its sides, and shown in a hypothetical cross section orientation similar to that of the two detector wafers illustrated in FIG. 2b. The potential of the single n-type wafer is shown by the curve in the lower section of FIG. 2c.

FIG. 2b shows the depleted regions (with the fixed + charges) and the bias potential across the two detectors under the one-sided, abrupt junction one-dimensional approximation being described. Neglecting the built-in and the thermal potential, a well-known expression for the thickness of the depletion region "d" is:

$$d = \sqrt{2\epsilon \frac{U}{q \cdot N_D}} \, , \, d \leq l/2 \quad (1)$$

Where U is the applied potential, $\epsilon$ is the absolute dielectric constant, q is the charge of an electron, and $N_D$ is the concentration of electrically active donors in a given semiconductor bulk.

From FIG. 2b and equation (1) it is seen that the formation of the depletion region with the potential drop U across it is a consequence of the reverse bias rectifying p+n junction. It should be understood that uncovered fixed positive charges that exist in the depletion region are compensated with an equal total negative charge "sitting" in the p+n junction. The n+n junction does not play any role in the mechanism of the depletion. Its only function is to conduct the removed electrons from the depletion region to the external contact.

There is shown in FIG. 2c the same electrostatic situation as existed in FIG. 2b, but with a single semiconductor wafer that is twice the thickness of the wafer shown in FIG. 2b, and with two p+n junctions, respectively, at the two outer surfaces of the wafer. It should be understood that a suitable connection is made to the undepleted central portion of the wafer by a contact (not shown) located at the edge of the wafer, in the manner shown in FIG. 2a. In the configuration of FIG. 2b, the undepleted portion of the semiconductor in the middle of the wafer acts as a conductor and replaces the function of the n+n junctions in the configuration shown in FIG. 2b. The mechanism of the depletion is identical to the classical p+n junction, i.e., it is the same as that in FIG. 2b, and is governed by equation (1). Thus, it can be seen that with increases in the bias voltage U, the depletion region increases at the expense of the thickness of the undepleted conductive channel.

Figure 2D:
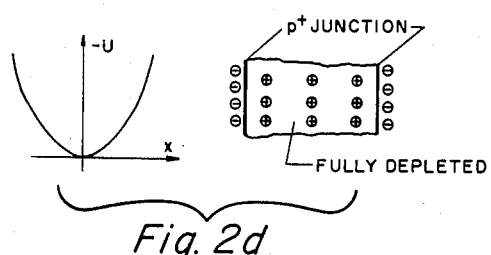
FIG. 2d shows in one of its sections a schematic hypothetical cross sectional plan view of the single n-type wafer shown in FIG. 2c, illustrating it in a fully depleted condition. The other section of FIG. 2d illustrates the electric potential across that fully depleted single n-type wafer.

FIG. 2d shows the limiting case of a fully depleted silicon wafer in which the central conductive channel has completely disappeared. We have discovered that instability of a fully depleted wafer against the thermal generation of electron/hole pairs is not a conceptual problem. The potential illustrated in FIG. 2d can be inclined in the direction perpendicular to the plane of the paper on which it is illustrated, in a way such that thermally generated electrons will be continuously swept toward the n+ anode. FIG. 3 shows the resulting potential function in two dimensions. It will be recognized that a section of this surface, with the plane y=0, gives the parabola illustrated in FIG. 2d. The uniform electric field applied along the y-axis is effective to transport electrons in the middle of the valley, or so called potential gutter, toward an anode (not shown) that is located further downstream in the manner that will be more fully described below. This diagram of a potential gutter illustrates some of the principles of operation of a semiconductor drift chamber constructed according to the present invention. We have found that electrons generated during the passage of a fast charged particle through such a drift chamber device, will be transported in this potential gutter from the position of their generation to an anode on the device. We have also, found that the time delay between such a passage of a fast particle and the measurement of signal at the anode is due to the drift of electrons. A measure of this time delay is directly proportional to the measure of the distance between the position of the fast particle and the position of the anode, thus, position can be determined in a manner similar to the principle of operation for a gas drift chamber position detector.

In order to verify the principles of operation of the subject invention, which depend on the depletion mechanism of a semiconductor via a so called virtual electrode, we tested a specially constructed device, of the type shown (not to scale) in FIG. 4a. The depicted disc shaped silicon device 1 included a wafer of bulk material of the n-type 10,000 Ohm cm ($N_D = 5 \times 10^{11}/cm^3$) silicon, which was supplied from Komatsu Corp. of Japan. The rectifying p+n barriers or junctions on both sides of the wafer were realized by vapor-depositing gold layers (2 and 3) on the n-type silicon wafer. Along the circular edge of the wafer 1, six independent aluminum n+ contacts 4 were formed by vapor deposition. A bias voltage was applied between the p+n, gold junctions 2 and 3 (each of which were connected to the same potential) and one of the aluminum n+ contacts 4. Two different capacitance/voltage (CV) characteristics were then measured. The first characteristic is the dependence of the capacitance between the two p+ contacts 2 and 3 on the bias voltage. The second characteristic is the capacitance between the two p+ contacts 2 and 3, connected together, and the n+ contact 4, as a function of the same bias voltage.

FIG. 4b shows the structural details for achieving the first measurement. The n+ contact 4 was connected to the external bias circuit, as illustrated in the upper section of FIG. 4b, through a suitably large (2,000 kohm) resistor. Accordingly, the undepleted silicon in the middle of the wafer behaved (at the frequency of measurement) as a floating conductor between two electrodes. The measured capacitance can be represented as the result of two capacitances connected in series, as shown in the lower section of FIG. 4b. The first capacitance is formed between the first p+ electrode 2 and the undepleted central channel, and the second capacitance is formed between the other side of that central channel and the other p+ electrode 3. The value of each capacitance depends on the depletion layer, thus, it depends on the bias voltage U as is shown by equation (1), above. When the bias voltage U is below the depletion voltage the capacitance is essentially that of the standard detectors connected in parallel, as shown in the lower portion of FIG. 4b. At full depletion, the conductive channel retracts, as shown in the upper section of FIG. 4c, and the capacitance drops abruptly, as illustrated. At still higher bias voltages, the remaining capacitance is the much lower capacitance that exists between the p+n junctions 2 and 3 and the undepleted silicon disposed around the n+ contact 4, as shown in the lower section of FIG. 4c.

Figure 5:
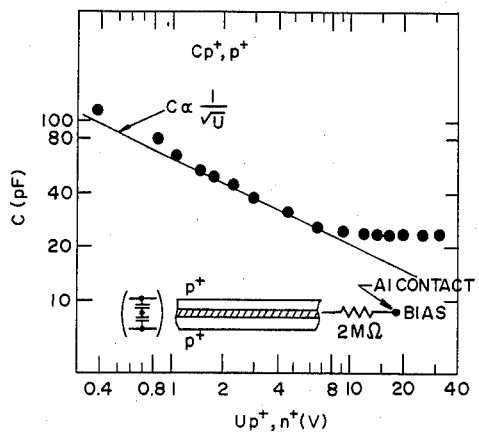
FIG. 5 is a graph showing the results of measuring the capacitance (picofarads) between the two p+ electrodes shown in FIG. 4, as a function of the bias voltage applied to those electrodes and the n+ contact.

FIG. 5 is a graph showing the result of the measurement of the first CV characteristic. In the low voltage region, of bias voltage U, the measured points closely follow the predicted $1\sqrt{U}$ dependence. Above the value of the bias voltage that corresponds to full depletion, the capacitance is purely geometrical and does not depend on variations in the voltage. The value of the depletion voltage thus demonstrated agrees with an independent measurement of the depletion voltage of a standard n-p detector constructed from the same material. We also found that the measured value of the final geometrical capacitance agrees with the calculated value. Details of the arrangement for achieving the second measurement are shown in FIG. 4c, as discussed above.

Figure 6:
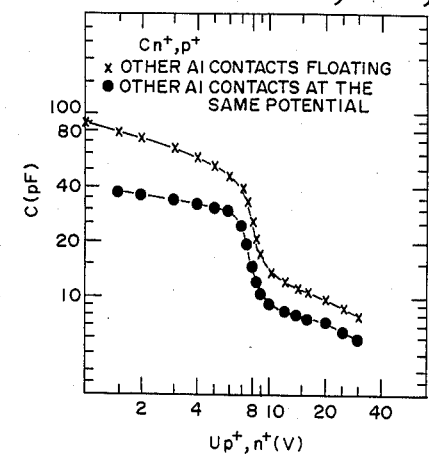
FIG. 6 is a graph showing variations in capacitance between two p+ electrodes connected together and all n+ contacts, as a function of the bias voltage. One curve shows that variation, measured with all but one n+ contact floating. The other curve shows that variation, measured with all the n+ contacts held at the same potential. The curves in the graph show an abrupt drop of the capacitance at the depletion voltage.

FIG. 6 displays the experimental results we obtained. The curves in FIG. 6 both show a sharp drop in the capacitance at the point where the bias voltage equals the total depletion voltage, as follows from the theory of the device. It is important to note that in order to confirm the full depletion, both measurements are required; because it is possible to obtain an abrupt drop in the second measurement by a pinch-off of the n channel only somewhere close to the contact point. The first measurement by itself is not sufficiently sensitive to prove that a complete depletion of the wafer has been achieved.

As mentioned at the outset, the principles of the present invention can be applied to make a variety of new devices. In order to better understand the application of those principles to such devices, it will help to summarize those principles in mathematical language. The electric field inside a semiconductor device will be described by the potential $\phi$ which defines the motion of carriers within the device and thus governs the behavior of the device. To provide a simplified calculation of the potential $\phi$ inside a semiconductor device, we neglected all built-in and thermal potentials, as well as the effect of currents inside the semiconductor. For purposes of understanding the present invention, both approximations are justified, because in the applications that will be described here the bias voltage dominates all other potentials and the signal currents are very small. Under these assumptions, the potential energy function $\phi$ inside a fully depleted semiconductor is defined by boundary conditions and has to satisfy Poisson's equation;

$$\Delta \phi = - \frac{N_D \cdot q}{\epsilon} \quad (2)$$

where $N_D$, q and $\epsilon$ retain their meaning from equation (1), above. We assumed a n-type, uniformly doped semiconductor. It will be recognized that it is easy to rewrite the equations for the opposite (p-type) configuration. We "constructed" the potential $\phi$ as the sum of two potential $\phi_1$ and $\phi_2$. We constrained the first potential $\phi_1$ to satisfy equation (2). Therefore, from the linearity of equation (2), the potential $\phi_2$ has to satisfy Laplace's equation;

$$\Delta \phi_2 = 0 \quad (3)$$

To fulfill the assumptions of small currents and the total depletion of the semiconductor, the resulting electric field has to provide reverse bias for all junctions and potential $\phi$ must not have any local minima or maxima. The physical interpertation of $\phi_1$ and $\phi_2$ will be apparent to those skilled in the art. The potential $\phi_1$ is a depletion potential and its form is a consequence of the fixed charge uncovered in a depleted semiconductor. The second potential $\phi_2$ has the form of the potential in a charge free region and is there to transport carriers in a desirable way. Because potential $\phi_2$ also transports thermally generated carriers, it will be understood that potential $\phi_2$ stabilizes the full depletion of a semiconductor in which it is established.

According to the present invention, the foregoing principles can be readily adapted to form a variety of different charge transport devices; for example, one such new device is a semiconductor drift chamber. The structural features of one preferred embodiment of such a drift chamber will be more fully explained below with reference to FIG. 8 and the associated FIGS. 9 and 10, which are used to explain the operating characteristices of that preferred embodiment of the invention. First though, to more generally consider the application of the principles of the invention as they should be adapted to work in a semiconductor drift chamber, it should be understood that in a one-dimensional case Poissons's equation (2) above reduces to the following ordinary differential equation:

$$\frac{d^2 \phi_1}{d_x 2} = - \frac{N_D q}{\epsilon} \quad (4)$$

which has the parabolic solution:

$$\phi_1 = - \frac{N_D q}{2\epsilon} (x - x_o)^2 + \phi_o \quad (5)$$

where $x_o$ and $\phi_o$ are the integration constants. The parabola shown in FIG. 2d is exactly this solution, with $x_o = \phi_o = 0$. (It should be understood that in all Figures of the drawing the negative potential, or the electron potential energy, is shown, as is normally done in current semiconductor literature. With this convention, it is understood that electrons are moved toward the lower values of $-\phi_2$.)

It should be understood that the potential $\phi_1$ given by equation (5) can be produced within an n-type semiconductor wafer having p+n rectifying junctions on both sides of the wafer, as is shown, for example, in FIG. 2, and as was described above. The so called potential gutter illustrated in FIG. 3 is the sum of the potential $\phi_1$, as given by equation (5) and the potential $\phi_2$, given by the following equation (6):

$$\phi_2 = -E \cdot y \quad (6)$$

The linear potential $\phi_2$ equation (6), clearly satisfies the Laplace's equation (3), above. The total potential $\phi$ shown by the potential gutter illustrated in FIG. 3, thus fully describes the field of a semiconductor drift chamber constructed and operated according to the invention, as discussed above with reference to FIGS. 2 and 3. Clearly the electric field due to the potential $\phi_2$ is effective to transport electrons for a long distance parallel to the major opposed surfaces of the semiconductor of such a drift chamber. The electric field related to potential $\phi_1$ brings the ionization to the center plane of such a semiconductor wafer and provides a focusing force during the drift movement of charge carriers in such a drift chamber.

In order to adapt the principles of the invention for use in making an ultra-low capacitance detector, it should be appreciated that the potential $\phi_2$, as given by equation (6) above, serves to move electrons in a semiconductor wafer, in a direction parallel to the y-axis, independently of the third coordinate z. (Referring to FIG. 3, it will be seen that the coordinate z is perpendicular to the axes X and Y therein, thus is parallel to the trough of the illustrated potential gutter.) Accordingly, the length of a charge collecting anode in the Z-direction on an associated semiconductor, cannot be shorter than the Z-dimension of such a semiconductor wafer detector, if the wafer is to operate suitably as an ultra-low capacitance detector, according to the invention. In order to achieve the smallest practical capacitance for an anode on such an ultra-low capacitance detector wafer, it has been found possible to use a point, or dot-size anode. The use of such a very low capacitance anode effectively minimizes the deleterious effects of the amplifier series noise on the total charge measurement of the detector. To achieve the desired charge carrier transport towards a point anode in such a low capacitance detector, the potential $\phi_2$ must have the following form:

$$\phi_2(x,y,z) = f(r), \text{ where } r^2 = y^2 + z^2; \quad (7) \; f(r_1) < f(r_2)$$
$$\text{for } r_1 > r_2$$

where f(r) satisfies the two dimensional Laplace's equation. If such a low capacitance detector is to be used to provide only total charge information, the exact form of f(r) is not important. Alternatively, if the measurement of the distance of a charge from the anode in such a detector is performed at the same time, a function f(r) having good calibration properties may be required. It will be appreciated that an advantageous feature of this kind of ultra-low capacitance detector is the inherent independence of the effective detector capacitance on the operative detector area. Thus, it is believed that a large area radiation detectors or photodiodes using this principle of the invention may have significantly improved noise performance, when compared to traditional diode detectors of the type known in the prior art.

Figure 7:
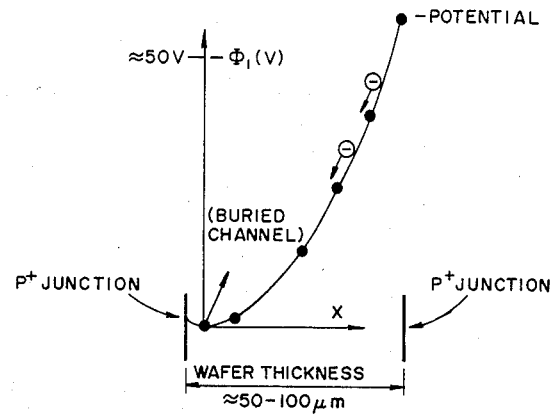
FIG. 7 is a graph showing variations in electrode potential across a fully depleted charge-coupled device wafer constructed according to the invention showing the rapid movement of electrons into the potential energy minimum of the wafer as it is positioned close to one side of the wafer.

Adaptation of the principles of the invention to make a fully depleted semiconductor wafer charge-coupled device will now be discussed with reference to FIGS. 3 and 7. It can be seen that if the total electric potential $\phi$, in a wafer, as graphically illustrated by the potential gutter shown in FIG. 3, were to be changed so that a different potential φ would be applied at the two respective major opposed surfaces of the wafer, there would be a resultant shift in location of the potential maximum. Specifically, the potential maximum, i.e. the minimum of the electron potential energy, will be moved from the center of the wafer toward one of its sides. The exact position of the potential maximum is the value of the integration constant $x_o$ given by equation (5), above. In the design and construction of a fully depleted charge-coupled semiconductor device, one has complete control of the constant $x_o$, through the selection of desired boundary conditions for the wafer. Thus, a designer can choose to locate the potential maximum close to one side of the wafer, as is represented by the graph of potential as a function of wafer thickness illustrated in FIG. 7 of the drawing. FIG. 7 shows that the potential existing in such a wafer close to the side thereof adjacent to the potential maximum, is similar to the potential of a buried-channel charge-coupled device (BCCD). The characteristics of such a BCCD were described by R. H. Walden, et al., in Bell System Technology Journal, Vol. 51, p 1635, (1972). Therefore, it will be appreciated that electrons can be transported in a fully depleted semiconductor charge-coupled device, in the same way as in a standard buried channel charge-coupled device, ie, under the action of a peristaltic charge pump. The potential field of such a peristaltic pump can be viewed as a dynamic generalization of the potential $\phi_2$ explained above with reference to equation (6).

A primary difference between a fully depleted charge-coupled semiconductor device (CCD) constructed according to the invention, and a standard buried channel charge-coupled device, is the full depletion achieved and utilized in the CCD of the invention. When such a fully depleted CCD is used as a particle detector, electrons produced anywhere inside of the semiconductor wafer will be moved rapidly to the electron potential energy minimum, as illustrated in FIG. 7, by the steep potential gradient path shown by the arrows parallel to that portion of the parabolic potential gutter curve illustrated therein. Following such movement of electrons toward one side of such a semiconductor wafer, as illustrated by the movement shown in FIG. 7 for a given wafer thickness of approximately 50–100 microns, the electrons are then transported due to the action of the peristaltic charge pump toward a suitable reading anode, as is done in a standard BCCD. It should be understood that in constructing a fully depleted CCD according to the invention, if the p+n junction at one side of the semiconductor wafer is made sufficiently shallow, the fully depleted CCD should be superior in performance to the special BCCD type of devices now used in astronomy. By making such a sufficiently shallow junction, the dead layer due to inactive silicon can be significantly decreased.

Figure 8:
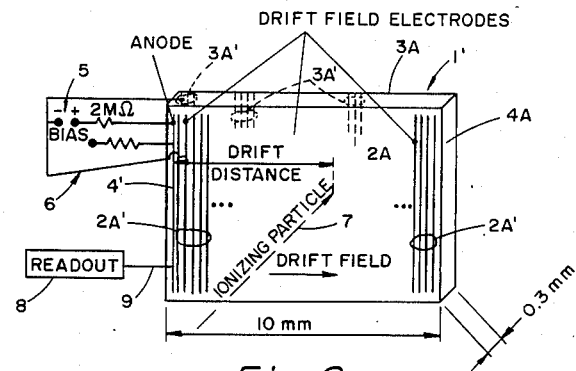
FIG. 8 is a schematic perspective view, not to scale, of a semiconductor wafer drift chamber constructed according to one preferred form of the subject invention. An array of strip p+ electrodes on the major surfaces of the wafer provide the depletion and drift field for it. Although such electrodes are distributed over the major opposed planar surfaces of the wafer, only the electrodes at the extreme ends of the wafer are depicted. A single strip anode electrode is the only readout channel for the wafer, so electrons produced by the passage of a fast ionizing particle entering the wafer drift toward that anode under the influence of the drift field.
Figure 9A:
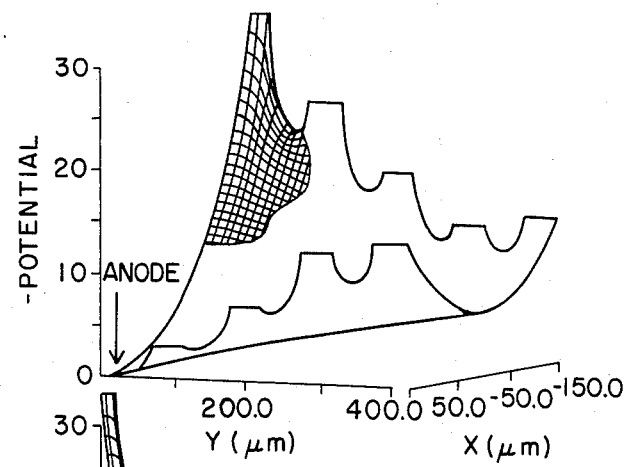
FIG. 9 is divided into sections 9a and 9b, each of which show the electrostatic potential that would exist in the embodiment of the drift field device shown in FIG. 8, responsive to the application of a higher negative potential bias on the p+n junctions on the side of the wafer opposite to the illustrated anode, than the bias on the p+n junctions located on the anode side of the wafer. Consequently, the bottom of the illustrated potential channel is turned so it moves electrons along it toward the anode. The views of the electrostatic configuration shown diagramatically in FIGS. 9a and 9b are two views of the same potential taken from different points.
Figure 9B:
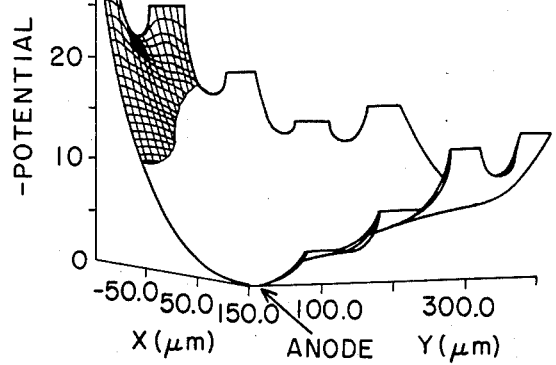
Figure 10:
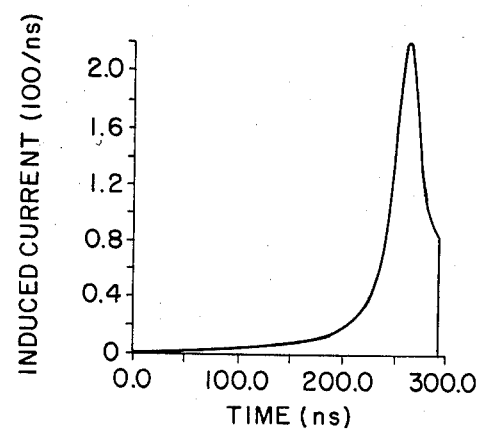
FIG. 10 is a graph showing current induced on the anode of the semiconductor drift chamber illustrated in FIG. 8, as such current would exist when an electric bias potential such as that shown in FIGS. 9a and 9b is applied to the wafer. The curve shows that the main portion of the signal is induced at the anode responsive to the distance of the moving charge from the anode being equal approximately to the anode width.

Now that the principles of the invention and their adaptation to the manufacture of various new devices has been explained, reference is made to FIGS. 8–10 to describe in greater detail a practical preferred embodiment of a charge transport device constructed according to the invention and adapted for use as a semiconductor drift chamber. In FIG. 8 the component parts of the illustrated drift chamber are designated by numbers corresponding to the numbers used in describing the functionally similar components of the semiconductor disc illustrated in FIG. 4, except that a prime symbol (') is used with the some of the designating numbers in FIG. 8. Thus, there is shown in FIG. 8 a thin semiconductor wafer 1' formed of high purity n-type silicon material. As noted above, those skilled in the art will recognize that the invention can also be practiced utilizing semiconductor wafers having p-type material therein, with appropriate corresponding adjustments being made in junctions, in the associated circuitry and other component parts. The wafer 1' has first and second major surfaces 2A and 3A and a thinner edge surface 4A which extends around the periphery of the wafer between the two major surfaces, as shown. In one prototype form of the invention, the first and second major surfaces were each made about 10 millimeters in width and height and the thinner edge surfaces were made about 300 microns thick, in the manner indicated by the dimensions illustrated in FIG. 8. Of course, other relative dimensions for suitable semiconductor wafers can be readily employed in making other embodiments of semiconductor drift chambers employing the principles of the invention.

A first rectifying electrode 2A' is formed as a plurality of strip electrodes that are distributed in an array over a major portion of the first major surface 2A of the wafer. As shown in FIG. 8, only a few of the strip electrodes 2A' are shown at the respective outer edges of the surface 2A, but it will be understood that in this preferred embodiment the distributed array of strip electrodes 2A' is made to extend over substantially the entire 10 millimeter width of the first major surface 2A, except near the extreme left end thereof, as shown. A suitable second rectifying electrode array 3A' is formed to the opposed second major surface 3A by conventional means, such as ion implantation or diffusion or by being formed of gold or another noble metal, that is vapor deposited onto the surface 3A. The second rectifying electrode 3A' is also formed as a plurality of strip electrodes that are distributed, respectively, in an array over a major portion of the second major surface 3A of the wafer 1'. In this form of the invention, although only two groups of the strip electrodes 3A' are illustrated by the dashed, or phantom, lines designated with the 3A' symbol in FIG. 8, it should be understood that similar strip electrodes extend over substantially the full 10 millimeter width of the major surface 3a in this embodiment of the invention. Similarly, although the strip electrodes 3A' are shown as only extending a portion of the height of the major surface 3A, those electrodes extend over substantially the full height of that surface. Although various suitable conventional methods may be used to form the strip arrays of the rectifying p+n junctions between the strip electrodes 2A' and 3A' and the respective major surfaces of the n-type silicon of wafer 1', in this embodiment of the invention both arrays of strip electrodes 2A' and 3A' are each formed by ion implantation or Boron diffusion or by depositing evaporated, photo-engraved gold on the respective major surfaces 2A and 3A.

Only a single readout electrode in the form of a small capacitance ohmic contact 4' is affixed to the wafer 1' adjacent to the edge surface 4A, as shown in the drawing. The ohmic contact 4' is a single strip of Phosphoric or Arsenic ion implantation, or vapor-deposited aluminum that is formed on a small part of the major surface 2A, immediately adjacent to the left edge of surface 4A in this embodiment of the invention. It will be recognized that in alternative embodiments of the invention the ohmic contact 4' can be made as a small capacitance contact that is vapor-deposited aluminum, or other suitable metal, formed directly on a portion of the edge surface 4A. The particular characteristic potential gutter that is achieved by forming the small capacitance contact 4' as a strip electrode on the edge of the major surface 2A, as shown in FIG. 8, will be more fully discussed with reference to FIGS. 9 and 10, below.

A source of one bias voltage 5 is illustrated schematically, as being connected by circuit means 6 to bias the wafer 1' in the manner discussed above with reference to the disc 1 shown in FIG. 4, above. Thus, the circuit means 6 is connected to apply a predetermined bias voltage across portions of the wafer 1', between the ohmic contact 4' and the respective electrodes 2A' and 3A', thereby to reverse bias the rectifying junction at each of those electrodes. It will be understood that although the schematic circuit means 6 shown in FIG. 8 is illustrated as being directly connected only to two of the strip electrodes 2A', and 3A' in the respective arrays on the opposed major surfaces 2A and 3A, conventional interconnection of the strip electrodes in each of those arrays is used to effect the desired biasing of all of the strip electrodes. Similarly, it should be understood that the predetermined bias voltage means 5 is effective to apply a desired bias voltage that is operable to form fully depleted regions in the portions of the wafer 1' situated between the ohmic contact 4' and the rectifying electrode arrays 2A' and 3A', in the manner discussed in more detail above with reference to FIG. 4.

The semiconductor drift chamber wafer 1' is operable to receive ionizing particles that are directed anywhere against its major surface 2A. One such ionizing particle path is shown by the dashed arrow 7 which indicates an ionizing particle being injected into the fully depleted regions of the wafer 1' at a given drift distance (shown by the arrow labeled "drift distance") from the ohmic contact, or anode, 4'. As an ionizing particle, (such as the one shown following path 7), moves through the depleted regions of the drift chamber, a charge is released on those regions due to the formation of electron/hole pairs.

An output means 8, which may be any suitable conventional readout circuit for detecting and indicating variations in the current induced in the anode 4' is illustrated in FIG. 8 schematically. The output means 8 is shown connected by a conventional conductor 9 to the anode 4' thereby to afford means for readily reading out changes in current induced at the ohmic contact 4' due to the transport of a charge carrier in the depleted regions of the device 1', as it is moved toward the contact 4'.

In the operation of the semiconductor drift chamber 1' illustrated in FIG. 8, it will be understood that a drift field potential, such as the potential $\phi_2$ discussed above, is formed by applying a predetermined desired linear potential from the biasing voltage means through the circuit means 6 to the arrays of strip electrodes 2A' and 3A' of rectifying p+n junctions on both of the major surfaces 2A and 3A of the device. As mentioned above, the bottom of the type of potential gutter discussed above with reference to FIG. 3 is moved, in the embodiment of the invention illustrated in FIG. 8, so that its bottom or the maximum potential portion is not situated at the center of the thin edge surface 4A. Instead, the maximum potential value of the potential gutter is situated on the major surface 2A' which is in engagement with the ohmic contact 4'.

FIG. 9 of the drawing shows the electrostatic configuration that accounts for the movement of the bend in the potential gutter. In the anode region of the drift chamber wafer 1', it will be appreciated that a different potential is applied to the p+n junctions formed by the strip electrodes 2A' on the front major surface 2A, relative to the potential applied to the junctions formed by the strip electrodes 3A' on the back major surface 3A of the wafer 1' (where potential measurements are made on the same given y-coordinate of the potential gutter). Thus, as shown by the two perspectives of the potential gutter shown in FIGS. 9a and 9b, the bottom of the potential gutter is moved toward the front side of wafer 1' at the left edge of major surface 2A, where the ohmic contact 4' is deposited. It will also be noted that the potential difference between the p+n junction on the respective major surfaces 2A and 3A' is largest in the plane of the potential gutter in which the anode contact 4' is located. In that particular plane of the potential gutter, as shown in FIGS. 9a and 9b, the semiconductor drift chamber 1' of the invention looks like a standard n-p junction detector.

In this embodiment of a charge transport device, which is adapted for use as a drift chamber in which the ohmic contact 4' is made substantially equal in length to one of the strip electrodes 2A' in the array of electrodes that is distributed over the first major surface 2A of the wafer 1', the device is expected to operate as a particle position detector in which position information is derived from the measurement of electron drift time and in the first order is independent of the number (or granularity) of the drift field defining p+ electrodes 2A' and 3A'. Thus, it will be appreciated that the objective mentioned at the outset, above, of providing a high resolution particle position detector is afforded by the invention, while avoiding any need for use of a much greater number of readout channels, as would normally be required in prior art position detectors.

A better understanding of the form of current that is induced at the ohmic contact or anode 4' in the preferred embodiment of the invention shown in FIG. 8, due to a unit of charge drifting in the depleted regions of the device, which has the geometry and applied electric potential field or gutter illustrated in FIGS. 9a and 9b, is depicted by the graph shown in FIG. 10. With such a potential gutter, the corresponding electron drift velocity is 1.3 microns per nanosecond. Thus, as shown in FIG. 10, the curve of the induced current at anode 4' starts when the detected charge is 500 microns away from the center of the anode 4', as measured along the y-axis. At that point, the effect of the moving charge is screened by surrounding p+ electrodes (i.e. those at the p+ junctions of the electrodes 2A' and 3A'). The main portion of the total charge is shown as being induced on the anode 4' when the distance of the moving charge from the anode is about the same as the width of the anode.

In order to calculate the position resolution of the preferred embodiment of the semiconductor drift chamber that was constructed and tested with the geometry shown in FIG. 8, the following position resolution limiting factors were considered:
(1) series amplifier noise
(2) electron diffusion (and mutual repulsion of electrons)
(3) detector leakage current.

Due to the much higher density and the smaller energy requirement to produce an electron/hole pair in the silicon of the wafer 1', compared to that required for a gas drift chamber, the two fundamental limitations of resolution for a gas drift chamber, i.e., δ-ray: production and small number of the primary ionization clusters are believed to be largely reduced, thus are not expected to limit the position resolution of the semiconductor drift chamber constructed according to the preferred embodiment of the invention.

In fact, the calculated position resolution for the drift chamber of the preferred embodiment of the invention was found to be in the region of 2 to 5 microns, depending primarily on the detector thickness (signal charge) and on the value of the drift velocity. The effect of amplifier noise increases with an increase in the drift velocity, while the other two contributions decrease, leading to some optimal drift velocity for a given detector thickness (i.e., 1 to 2 microns per nanosecond, for a 300 micron thick semiconductor wafer) drift chamber constructed according to the preferred embodiment of the invention shown in FIG. 8. It will be recognized that this rather low value may not be the most desirable drift velocity for some applications of a drift chamber. It will also be appreciated that for a higher drift velocity, the position resolution of such a drift chamber is limited mainly by the amplifier noise. In order to circumvent that problem, one can use the local transistor action at the $p^+n$ junction next to the anode 4' to provide a charge gain.

From the foregoing description of the invention, it will be understood that in the new charge transport method and device that has been disclosed, the charge transport potential is independent of the depletion voltage, as proposed at the outset above. In addition to the application of the principles of the invention to make the several new charge transport and detector devices discussed, it should be appreciated that those principles can be practiced as a new method for making charge transport devices.

Only a brief explanation of the characteristic steps of such a novel method are needed, in light of the details of the invention already explained. Thus, in the most preferred arrangement of the method of the invention one provides a wafer of semiconductor material, such as the wafer 1' illustrated in FIG. 8, which has a first and a second rectifying electrode formed respectively, to its first and second major surfaces, and which has a small capacitance ohmic contact formed to it immediately adjacent to one of its edge surfaces, all as generally illustrated, for example, in FIG. 8. A subsequent step in such a method is to apply a predetermined bias voltage across portions of the wafer, between the contact and the respective electrodes on the major surfaces of the wafer in order to reverse bias the rectifying junctions at each of the electrodes, and to form fully depleted regions in the portions of the wafer between the ohmic contact and the electrodes. The next step of the method is to introduce one or more ionizing particles into the fully depleted regions of the wafer thereby to impose or release charge carriers from the ionizing particles into those regions. Finally, in one form of the method of the invention, output means are operatively coupled to the ohmic contact to provide a readout of changes in the current induced at that contact, responsive to the transport of a charge in the depleted regions of the wafer, toward the contact, all as shown in FIG. 8 and discussed generally above with reference to the preferred embodiment of the drift chamber disclosed with reference to that Figure of the drawing.

In practicing the method of the invention to make a charge transport device constructed according to the invention as a particle position detector, further means would be provided for measuring the time of introduction of ionizing particles into the depleted regions of the wafer. Then, measurements would be taken of the time that a maximum current is induced at the ohmic contact, responsive to transport of a charge in the semiconductor wafer, toward the ohmic contact. Such measurements thereby indicate the position of introduction of the ionizing particle into the depleted regions of the semiconductor device. In a preferred form of the method of the invention, a manufacturing step is included whereby the small capacitance ohmic contact is either ion implanted into the surface of the semiconductor wafer or is affixed as a vapor-deposited spot contact of metal applied to a thin edge surface of the wafer, intermediate the major surfaces (2A and 2B, as seen in FIG. 8) thereon. Such an arrangement is effective to cause the depleted regions of the wafer to encompass substantially the entire wafer. Alternatively, the method of the invention can be varied to include a step for forming the small capacitance contact (4') on a major surface of the wafer.

From the foregoing disclosure of the invention those skilled in the art will recognize that further modifications and alternative embodiments of it may be formed without departing from its intended true scope. Accordingly, it is our intention to define in the following claims the true spirit and limits of the invention.

We claim:

1. A charge transport device adapted for use as a drift chamber comprising:

a wafer of semiconductor material having first and second major surfaces and a thinner edge surface, each of said major surfaces being less than 15×15 centimeters square and more than 0.3×0.3 centimeters square, and the width of said edge surface, measured between the major surfaces, being in the range of 0.1 to 1.0 millimeters.

a first rectifying electrode formed on or affixed to said first major surface, a second rectifying electrode formed on or affixed to said second major surface, said first and second rectifying electrodes each being formed of a plurality of strip electrodes that are distributed, respectively, in arrays over major portions of said first and second major surfaces, and a small capacitance ohmic contact comprising several articulated contact strips which in combined length are substantially equal in length to one of the strip electrodes in one of said arrays, said ohmic contact being formed on or affixed to said wafer adjacent to or on said edge surface, whereby the ohmic contact is positioned closer to the edge surface of the wafer than is the rectifying strip electrode that is closest to the ohmic contact, a voltage source and circuit means connected to apply predetermined bias voltages across portions of the wafer between said contact and the respective electrodes, thereby to reverse bias the rectifying junction at each of said electrodes to form a charge transport potential for continuously moving charged particles or charge carriers away from said electrodes and toward the ohmic contact, said predetermined bias voltages being further and independently effective to form fully depleted regions in said portions of the wafer between the ohmic contact and the rectifying electrodes, said device being operable to receive ionizing particles or radiation into said fully depleted regions, for detecting a charge released in said regions, and for measuring the position or energy of said detected charge, and output means operatively coupled to said ohmic contact to read out changes in current induced at the contact due to the transport of a charge in the depleted regions of the device to said contact, thereby to provide a measure of the position and energy of a detected particle.

2. An invention as defined in claim 1 wherein the resolution of said drift chamber is in the range of 2 to 10 microns, responsive to said predetermined bias voltage being adjusted to maintain drift velocity in the chamber at about 5 microns per nanosecond for a 300 microns width of said edge surface.

* * * * *